| United States Patent [19] | [11] | Patent Number: | 4,762,808 |
|---|---|---|---|
| Sharp et al. | [45] | Date of Patent: | Aug. 9, 1988 |

[54] METHOD OF FORMING SEMICONDUCTING AMORPHOUS SILICON FILMS FROM THE THERMAL DECOMPOSITION OF FLUOROHYDRIDODISILANES

[75] Inventors: Kenneth G. Sharp, Midland; John J. D'Errico, Fenton, both of Mich.

[73] Assignee: Dow Corning Corporation, Midland, Mich.

[21] Appl. No.: 64,641

[22] Filed: Jun. 22, 1987

[51] Int. Cl.$^4$ .......................................... H01L 21/205
[52] U.S. Cl. ...................................... 437/101; 437/4; 427/74; 423/349; 136/258
[58] Field of Search .................... 437/4, 101; 427/74; 423/349; 136/258 AM

[56] References Cited

U.S. PATENT DOCUMENTS

| 2,606,811 | 8/1952 | Wagner | 423/342 |
|---|---|---|---|
| 4,064,521 | 12/1976 | Carlson | 357/2 |
| 4,079,071 | 3/1978 | Neale | 556/468 |
| 4,196,438 | 4/1980 | Carlson | 357/15 |
| 4,217,374 | 8/1980 | Ovshinsky et al. | 427/39 |
| 4,374,182 | 2/1983 | Gaul et al. | 428/446 |
| 4,450,185 | 5/1984 | Shimizu et al. | 427/39 |
| 4,459,163 | 7/1984 | MacDiarmid | 148/174 |
| 4,485,121 | 11/1984 | Matsumura | 427/39 |

FOREIGN PATENT DOCUMENTS

| 8203069 | 9/1982 | PCT Int'l Appl. |
| 2148328 | 5/1985 | United Kingdom |
| 2156385 | 10/1985 | United Kingdom |

OTHER PUBLICATIONS

A. Madan et al., *Philosophical Magazine B*, vol. 40, No. 4, pp. 259–277 (1979).
H. Matsumura et al., *Conference Record, 18th IEEE Photovoltaic Specialists Conf.*, (1985), pp. 1277–1282.
Auguelli and Murri, *Mat'ls. Chem. and Phys.* (Switzerland) 9, 301–5 (1983).

*Primary Examiner*—Aaron Weisstuch
*Attorney, Agent, or Firm*—James E. Bittell

[57] ABSTRACT

The invention relates to a method of forming amorphous, photoconductive, and semiconductive silicon films on a substrate by the vapor phase thermal decomposition of a fluorohydridodisilane or a mixture of fluorohydridodisilanes. The invention is useful for the protection of surfaces including electronic devices.

8 Claims, No Drawings

METHOD OF FORMING SEMICONDUCTING AMORPHOUS SILICON FILMS FROM THE THERMAL DECOMPOSITION OF FLUOROHYDRIDODISILANES

STATEMENT OF GOVERNMENT RIGHTS

The United States Government has rights in this invention pursuant to Subcontract ZL-5-04074-6 under Prime Contract No. DE-AC02-83CH10093 awarded by the U.S. Department of Energy.

BACKGROUND OF THE INVENTION

The present invention relates to the discovery that pyrolysis of certain fluorohydridodisilanes or mixtures of fluorohydridodisilanes can result in the formation of a highly stable, highly reflective, highly abrasion resistant, photoconductive, semiconductor film on a substrate.

Amorphous polymeric materials of silicon and hydrogen (hereafter referred to as a-SiH) have emerged as a new class of semiconductors in recent years. The materials are generated as thin films from the decomposition of silane ($SiH_4$) in electrical discharges or, less frequently, from the thermal decomposition of silane or higher hydrogen-containing silanes (e.g., $Si_2H_6$, $Si_3H_8$, etc.) as described in U.S. Pat. No. 4,459,163, issued July 10, 1984 to MacDiarmid et al.

A disadvantage of the use of silane, disilanes or polysilanes ($Si_nH_{2n+2}$) as a starting material for generation of a-SiH relates to the significant explosion hazard of silane/air mixtures. An operational consequence of this explosion hazard is the frequent use of inert carrier gases as diluents in these systems. Both chemical vapor deposition (CVD) and discharge (plasma CVD) routes to a-SiH from silane also have disadvantageous features. Discharge systems require relatively sophisticated and expensive equipment. Silane-based CVD systems, while simple, suffer from the tendency to undergo vapor nucleation unless the pressure is very low. This behavior restricts the range of permissible operating conditions for such thermal decompositions.

When it is desirable to include additional elemental constituents in the amorphous films, co-reactants such as phosphine ($PH_3$) or diborane ($B_2H_6$) are commonly added to the starting materials. When fluorine is to be incorporated into an amorphous film, tetrafluorosilane ($SiF_4$) is most commonly added to the reactant mixture. This is described for example in U.S. Pat. No. 4,217,374 granted to Ovshinsky and Izu on Aug. 12, 1980.

U.S. Pat. No. 4,374,182, issued Feb. 15, 1983 to Gaul et al., discloses decomposing halogenated polysilanes at an elevated temperature. Gaul et al., however is limited to the pyrolysis of polychloropolysilanes and does not teach the use of fluorohydridodisilanes. Further, Gaul et al. specifies the formation of elemental silicon (i.e., with no halogen) in a solid state transformation rather than from a vapor phase deposition. Gaul et al., is therefore distinguished from the instant invention directed to the production of reflective, amorphous films produced from flurohydridodisilanes.

U.S. Pat. Nos. 2,606,811, issued on Aug. 12, 1952 to Wagner and 4,079,071, issued on Mar. 14, 1978 to Neale, addressed the decomposition at elevated temperatures of halogenated disilanes. However, these patents are distinguished from the instant invention because both are directed toward the hydrogenation of di- and polysilanes for the formation of silanes, and more specifically, the formation of monosilanes. Wagner teaches the process of making a compound with a single silicon atom by heating in the presence of hydrogen a compound containing a halogen and a Si—Si bond. Neale teaches the metal catalyzed process of preparing compounds of the formula $H_a(CH_3)_xSiCl_{4-(a+x)}$ by contacting a polysilane with hydrogen gas under pressure and heat. Neither Wagner nor Neale teach the vapor phase deposition of amorphous silicon films from the thermal decomposition of fluorohydridodisilanes as taught in the instant invention. In fact, Wagner and Neal are specifically directed toward the hydrogenation of chlorosilanes, not fluorosilanes.

United Kingdom Pat. No. 2,148,328, issued to M. Hirooka, et al., on May 30, 1985, teaches the decomposition of various silanes, including monomeric halosilanes ($SiX_4$), cyclic polymeric halosilanes ($SiX_2)_n$, where n is greater than or equal to 3, di- and polysilanes such as $Si_nHX_{2n+1}$ and $Si_nH_2X_{2n}$. These materials are decomposed via electric discharge, or photolysis, or high temperature or catalytically and, unlike the instant invention, are mixed with a requisite second stream consisting of a vapor phase material selected from the group consisting of $H_2$, $SiH_4$, $SiH_3Br$, or $SiH_3I$ wherein the second stream has also been decomposed. The obvious disadvantage of such prior art, one which clearly distinguishes it from the instant invention, is the necessity of having two materials to decompose. The United Kingdom patent requires the second stream as the source of hydrogen to facilitate the reduction of the silane to the amorphous silicon. The instant invention, however, has sufficient hydrogen and silicon in the single stream of fluorohydridodisilane to produce the desired amorphous silicon film. In addition, the hydrogen-containing films produced by the instant invention possess the low defect density and high dopability characteristic of a-SiH films. The films of the instant invention, retaining fluorine bonded to silicon, exhibit the high thermal stability characteristic of fluorosilicon materials. Yet the instant invention does not require a second source of either fluorine or hydrogen as a decomposable starting material.

United Kingdom Pat. No. 2,156,385, published Oct. 9, 1985 and issued to Tanaka et al., teaches the use of fluorinated monosilanes and one partially fluorinated disilane, $Si_2H_4F_2$, as precursor materials for the formation of silicon films on a substrate. However, United Kingdom Pat. No. 2,156,385 is directed solely to plasma discharge deposition.

U.S. Pat. No. 4,485,121, issued Nov. 27, 1984 to Matsumura teaches the use of electric discharge in the presence of a mixed gas of silicon difluoride or silicon monofluoride gas with hydrogen gas and depositing the decomposed gas on a substrate. Matsumura does not teach the use of flurohydridodisilanes.

Thus the instant invention is distinguished from prior art utilizing monosilanes, disilane ($Si_2H_6$), polysilanes, and systems requiring dual streams of starting materials one of which is a reducing agent, e.g., hydrogen gas, and systems dependent on plasma, glow or other electric discharges. Furthermore, the instant invention, utilizing selected fluorohydridodisilanes with fixed and known ratios of constituents on the silicon atom, provides greater control and uniformity in the distribution of fluorine and hydrogen in the resulting amorphous silicon-containing film than does the relatively crude alternative of coreacting materials such as tetrafluorosilane and hydrogen.

SUMMARY OF THE INVENTION

The present invention relates to the formation of amorphous silicon films prepared solely by thermal decomposition, often referred to as chemical vapor deposition (CVD). The films are formed from vapor phase decomposition of fluorodisilanes at elevated temperatures. No additional source of hydrogen is needed in the instant invention.

The instant invention also simplifies the feed process of the material to be decomposed by reducing the number of reactants from two to one since an additional source of hydrogen is not required. The hydrogen initially on the fluorinated disilane results in silicon-hydrogen bonds in the film and lowers the defect density in the amorphous silicon film.

A further aspect of the invention relates to the formation of electronic, electro-optical, and photovoltaic devices including, for example, solar cells, thin film transistors, or optical data storage media, as well as corrosion resistant coatings, abrasion resistant coatings and devices and articles derived therefrom. A variety of possible devices based on amorphous silicon-containing films derived from the instant invention will be apparent to those skilled in the art.

DETAILED DESCRIPTION

The instant invention produces reflective, air-stable silicon-containing amorphous films from the decomposition of fluorohydridodisilanes, i.e., fluorinated or partially fluorinated disilanes. The term "amorphous" is herein construed to include both noncrystalline and microcrystalline materials, in which the crystallites are less than 50 Angstroms in dimension, and are not contiguous so as to form well defined grain boundaries. The films produced by the method of the instant invention exhibit strong adhesion to substrates, are abrasion resistant, and are strong absorbers of visible light. Fluorohydridodisilanes, such as fluorodisilane, $FSi_2H_5$, difluorodisilane, $F_2Si_2H_4$, trifluorodisilane, $F_3Si_2H_3$, tetrafluorodisilane, $F_4Si_2H_2$, and pentafluorodisilane, $F_5Si_2H$ are, according to the present invention, admitted to a previously evacuated container or decomposition reactor along with a substrate to be coated with an amorphous silicon film. Both the container and substrate are first cleaned (e.g., in an alkaline detergent) and rinsed with a highly purified solvent, preferably water or "electronic grade" methanol. The fluorohydridodisilane is transferred to the container or reactor in such a manner as to preclude exposure to the atmosphere. The choice of substrates is limited only by the need for thermal and chemical stability at the decomposition temperature in the atmosphere of the decomposition reactor. Thus the substrate to be coated can be, for example but is not limited to, various types of glass, metals, plastics able to withstand the temperatures, or minerals. In the instances of a glass container, the container is sealed and heated in an oven or furnace for a time generally in the range of 10 to 60 minutes to a temperature sufficient to cause the thermal decomposition of the fluorohydridodisilane or mixture of fluorohydridodisilanes, and preferably in the range of from 300 degrees Centigrade to 600 degrees Centigrade. During this time the starting material decomposes and forms an amorphous silicon-containing film on the substrate.

In a decomposition reactor, the fluorohydridodisilane or mixture of fluorohydridodisilanes can be decomposed either statically (i.e., without reactant flow) or dynamically, with the reactant gas flowing over the heated substrate. In static reactions, the reaction by-products, mixtures of various fluorohydridodisilanes, fluorohydridomonosilanes and hydrogen (and any unreacted starting material if present), may conveniently be removed by evacuation after the container has been reattached to the vacuum line. The substrate, onto which the decomposed fluorohydridodisilane starting material has deposited an amorphous silicon film, is then removed. By this method, $Si_2F_5H$ and $Si_2F_3H_3$ were thermally decomposed to produce amorphous silicon-containing films on various substrates. The resulting coatings are reflective, air-stable, abrasion resistant, photoconductive, semiconductive amorphous silicon-containing films possessing high thermal stability due to the fluorine content and low defect density and high dopability due to the hydrogen content.

The high strength of the bond of fluorine to silicon and the impossibility of loss of elemental fluorine from the resulting Si/F film account for the unique character of the materials of the instant invention and their ability to perform as high temperature semiconductors. Amorphous films prepared from trifluorodisilane by the instant invention have band gaps comparable to those of a-SiH films, but their chemical and electrical properties are not degraded at temperatures where the purely hydrogenated material is destroyed.

Films produced by the instant invention are useful as semiconducting materials in photovoltaics, passive optical layers, corrosion resistant coatings, and abrasion resistant coatings, among other applications obvious to those skilled in the art.

The present invention relates to the formation of semiconducting films from the thermal decomposition of disilane precursors which contain both fluorine and hydrogen as substituents on silicon. The fluorohydridodisilanes are of the general formula $Si_2F_xH_{(6-x)}$. To the applicants' knowledge, none of the eight molecules in the above general family has been used in a CVD environment as a source of amorphous silicon films for semiconductors. These materials are, in the main, considerably less hazardous to manipulate than disilane itself.

The following examples are given by way of illustration only in order to describe the invention in greater detail, and are not intended to limit the scope thereof.

EXAMPLE 1

Pentafluorodisilane (20 Torr) was placed in a cleaned Pyrex ampoule along with a Corning 7059 glass substrate. The ampoule was sealed and heated for 30 minutes at a temperature of 350 degrees Centigrade. The ampoule was cooled to room temperature and then attached to a vacuum line to remove the by-products. The ampoule was broken and the film-coated substrate removed. Film thickness was determined by a surface profilometer to be approximately 375 Angstroms (A). The film was golden-brown in color, with a high reflectivity. Dark conductivity of the film was measured to be $1.1 \times 10^{-9}$ Siemens/centimeter (S/cm), photoconductivity was $1.8 \times 10^{-7}$ S/cm under AM-1 light.

EXAMPLE 2

Pentafluorodisilane was placed in a Pyrex demountable reactor at a pressure of 65 Torr. Film deposition onto a Corning 7059 glass substrate heated to 375 degrees Centigrade took place over a period of 60 minutes. The reactor was cooled to room temperature, attached to a vacuum line to remove the by-products, and the film-coated substrate removed. Film thickness was determined by a surface profilometer to be approximately 700 A. The film was golden-brown in color, with a high reflectivity.

EXAMPLE 3

Pentafluorodisilane (20 Torr) was decomposed in a Pyrex demountable reactor at a temperature of 400 degrees Centigrade for one hour. At the conclusion of the reaction, the reactor was recharged with pentafluorodisilane to the same initial pressure, and the reaction repeated without removal of the substrate. At the conclusion of this second run, the reactor was again recharged to 20 Torr pressure of pentafluorodisilane and deposition resumed. After a total of three hours, the substrate with the deposited film was removed. Film thickness was determined by a surface profilometer to be approximately 500 A. The film was golden-brown in color, with a high reflectivity. Dark conductivity of the film was measured to be $2.2 \times 10^{-8}$ Siemens/centimeter (S/cm), photoconductivity was $1.0 \times 10^{-6}$ S/cm under AM-1 light.

EXAMPLE 4

1,1,1-Trifluorodisilane ($F_3SiSiH_3$) (70 Torr) was decomposed in a sealed ampoule at 380 degrees Centigrade for 40 minutes in the presence of a Corning 7059 glass substrate. Film thickness on the substrate was determined by a surface profilometer to be approximately 700 A. The film was golden-brown in color, with a high reflectivity. Dark conductivity of the film was measured to be $3.4 \times 10^{-12}$ (S/cm), photoconductivity was $8.90 \times 10^{-8}$ S/cm under AM-1 light.

EXAMPLE 5

Pentafluorodisilane (240 Torr) was placed in a cleaned Pyrex ampoule along with a Corning 7059 glass substrate. The ampoule was sealed and heated for 40 minutes at a temperature of 490 degrees Centigrade. The ampoule was cooled to room temperature and then attached to a vacuum line to remove the by-products. The ampoule was broken and the film-coated substrate removed. Film thickness was determined by a surface profilometer to be approximately 1000 A. The film was golden-brown in color, with a high reflectivity. Dark conductivity of the film was measured to be $1.81 \times 10^{-12}$ S/cm, photoconductivity was $1.70 \times 10^{-7}$ S/cm under AM-1 light.

That which is claimed is:

1. A method of forming an amorphous silicon-containing film on a substrate, which method comprises the step of decomposing a vapor phase consisting essentially of a fluorohydridodisilane or mixture of fluorohydridodisilanes, wherein the fluorohydridodisilane is represented by the formula $Si_2F_xH_{6-x}$ wherein x is an integer from 1 to 5, at a temperature sufficient to cause the thermal decomposition of the fluorohydridodisilane or mixture of fluorohydridodisilanes in a reaction chamber which contains, or is connected to a chamber containing, a substrate which is thermally and chemically stable at the decomposition temperature in the atmosphere of the reaction chamber, whereby said film is formed on said substrate.

2. A method as claimed in claim 1 wherein the temperature range is from 300 degrees Centigrade to 600 degrees Centigrade.

3. A method as claimed in claim 2 wherein the substrate is glass.

4. A method as claimed in claim 2 wherein the substrate is steel.

5. A method as claimed in claim 2 wherein the substrate is aluminum.

6. A method as claimed in claim 2 wherein the substrate is plastic.

7. A method as claimed in claim 1 wherein the fluorohydridodisilane or mixture of fluorohydridodisilanes is thermally decomposed under static conditions.

8. A method as claimed in claim 1 wherein the fluorohydridodisilane or mixture of fluorohydridodisilanes is thermally decomposed under dynamic conditions.

* * * * *